United States Patent
Maloberti et al.

(10) Patent No.: US 7,372,386 B1
(45) Date of Patent: May 13, 2008

(54) PARALLEL DIGITAL-TO-ANALOG-CONVERTER

(75) Inventors: Franco Maloberti, Torre D'Isola (IT); Gabriele Manganaro, Boxborough, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/556,104

(22) Filed: Nov. 2, 2006

(51) Int. Cl.
H03M 1/66 (2006.01)

(52) U.S. Cl. ................ 341/144; 341/137; 708/410; 342/485

(58) Field of Classification Search ................ 341/144, 341/155, 137; 342/465; 708/410
See application file for complete search history.

(56) References Cited

U.S. PATENT DOCUMENTS

| | | | |
|---|---|---|---|
| 3,795,864 A * | 3/1974 | Fulton Jr. ................... | 708/410 |
| 6,411,645 B1 * | 6/2002 | Lee et al. ................... | 375/140 |
| 6,525,682 B2 * | 2/2003 | Yap et al. ................... | 341/137 |
| 6,765,533 B2 * | 7/2004 | Szajnowski ................ | 342/465 |
| 2006/0279445 A1 * | 12/2006 | Kinyua et al. .............. | 341/155 |

OTHER PUBLICATIONS

William C. Black Jr. et al., "Time Interleaved Converter Arrays," IEEE International Solid-State Circuits Conference, Feb. 1980, pp. 14-15 and 254.

William C. Black Jr. et al., "Time Interleaved Converter Arrays," IEEE Journal of Solid-State Circuits, vol. SC-15, No. 6, Dec. 1980, pp. 122-1029.

Naoki Kurosawa et al.,"Explicit Analysis of Channel Mismatch Effects in Time-Interleaved ADC Systems," Transactions on Circuits and Systems-I: Fundamental Theory and Applications, vol. 48, No. 3, Mar. 2001, pp. 261-271.

Daihong Fu et al., "A Digital Background Calibration Technique for Time-Interleaved Analog-to-Digital Converters," IEEE Journal of Solid-State Circuits, vol. 33, No. 12, Dec. 1998, pp. 1904-1911.

Kenneth C. Dyer et al., "An Analog Background Calibration Technique for Time-Interleaved Analog-to-Digital Converters," IEEE Journal of Solid-State Circuits, vol. 33, No. 12, Dec. 1998, pp. 1912-1919.

G. Manganaro, "Feed-forward approach for timing skew in interleaved and double-sampled circuits," Electronics Letters, vol. 37, No. 9, Apr. 26, 2001, pp. 552-554.

Gabriele Bernardinis et al., "Dynamic Stage Matching for Parallel Pipeline A/D Converters," 2002 IEEE, Symp. On Circuits and Systems, vol. I, pp. 905-908, month unknown.

* cited by examiner

*Primary Examiner*—Jean B Jeanglaude
(74) *Attorney, Agent, or Firm*—Patent Law Group LLP; Carmen C. Cook (57) ABSTRACT

A method for performing parallel digital-to-analog conversion of an n-bit digital input data signal at a frequency of $f_s$ including receiving the n-bit digital input data signal; generating M−1 delayed input data signals, M being the number of parallel conversions channels, the M−1 delayed input data signals having respective increasing amount of unit delay, the digital input data signal and the M−1 delayed input data signals forming M digital signals; holding the M digital signals for a first time period; performing a data transformation of the M digital signals using an M×M Hadamard matrix; generating M (n+m)-bit transformed digital data signals; converting each of the M transformed digital data signals to M analog signals; and performing a reverse data transformation of the M analog signals based on the M×M Hadamard matrix to generate an output analog signal indicative of the n-bit digital input data signal.

17 Claims, 5 Drawing Sheets

PARALLEL DIGITAL-TO-ANALOG-CONVERTER

FIELD OF THE INVENTION

The invention relates to digital-to-analog converters and, in particular, to a parallel digital-to-analog converter implementing time-interleaving for improved speed and reduced noise and power consumption.

DESCRIPTION OF THE RELATED ART

Figure 1:
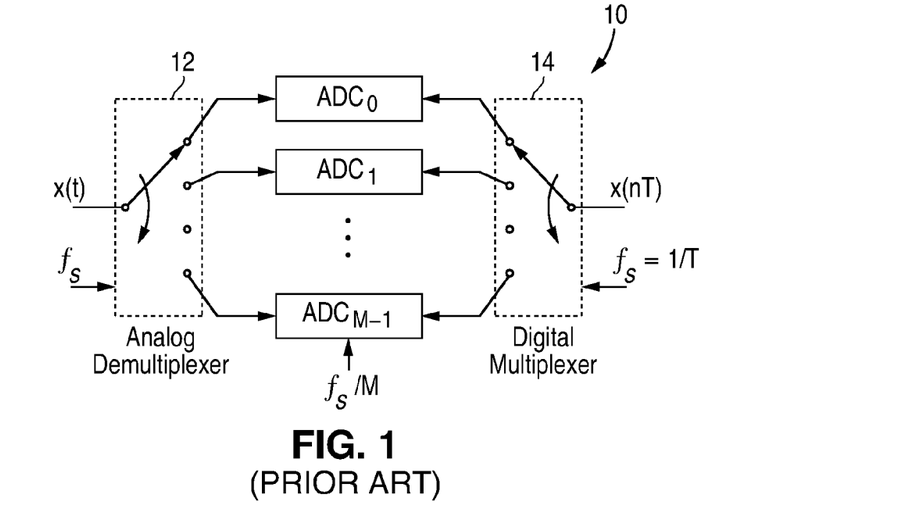
FIG. 1 is a schematic diagram of a conventional analog-to-digital converter (ADC) implementing time-interleaving.

Time-interleaving is a technique that has been applied to analog-to-digital converters to implement parallel analog-to-digital conversion. FIG. 1 is a schematic diagram of a conventional analog-to-digital converter (ADC) implementing time-interleaving. Referring to FIG. 1, an n-bit analog-to-digital converter (ADC) 10 with a sample frequency $f_s=1/T$, is implemented using an array of M identical n-bit ADCs ($ADC_0$ to $ADC_{M-1}$), each ADC sampling at frequency $f_s/M$ and clocked with appropriately time-delayed sampling control signals. ADC 10 also includes an analog demultiplexer 12 to sample the input analog signal x(t) and a digital multiplexer 14 to generate the digitized output signal x(nT). Analog-to-digital converters $ADC_0$ to $ADC_{M-1}$ will be referred to as sub-analog-to-digital converters or sub-ADCs in the present description.

In the ADC 10 of FIG. 1, the analog input signal x(t) is periodically supplied to each ADC of the ADC array through analog demultiplexer 12 so that $ADC_0$ will sample x(t), $ADC_1$ will sample x(t+T), . . . , and $ADC_{M-1}$ will sample x(t+(M−1)T). Then, the sampling returns to $ADC_0$ where $ADC_0$ will sample x(t+MT), $ADC_1$ will sample x(t+(M+1)T) and so on. Correspondingly, at the output side of the ADC array, the digitized output x(nT) is obtained through the digital multiplexer 14 which will select the output of $ADC_0$ at t+Δ, the output of $ADC_1$ at t+Δ+T, . . . , the output of $ADC_{M-1}$ at t+Δ+(M−1)T, and so on, where Δ is the conversion time of each individual ADC in the array.

The main advantage of the time-interleaving approach is that, by using individual parallel sub-ADCs $ADC_0$ to $ADC_{M-1}$ each operating at a lower frequency (frequency $f_s/M$ instead of $f_s$), it is possible to digitize x(t) at an effective rate $f_s$. It is often prohibitive to use a single ADC directly digitizing at rate $f_s$ due to technology limits. Even when digitizing at a high rate is possible, such an ADC may have large power consumption because, for a given resolution and sample rate, the time-interleaved implementation has the potential to require overall less power than the traditional single ADC implementation.

The main drawback of a parallel time-interleaved analog-to-digital converter is the higher complexity of the system, which, in turn, may result in an overall larger device area compared to the case of a traditional single, higher sampling rate, ADC.

The parallel time-interleaved ADC has another drawback. The sub-ADCs $ADC_0$ to $ADC_{M-1}$ in the ADC are ideally identical. However, the core analog circuits forming the sub-ADCs are unavoidably affected by manufacturing mismatches. Mismatches between the sub-ADCs introduce severe performance limitations on the practical effectiveness of parallel time-interleaved ADCs.

Figure 2:
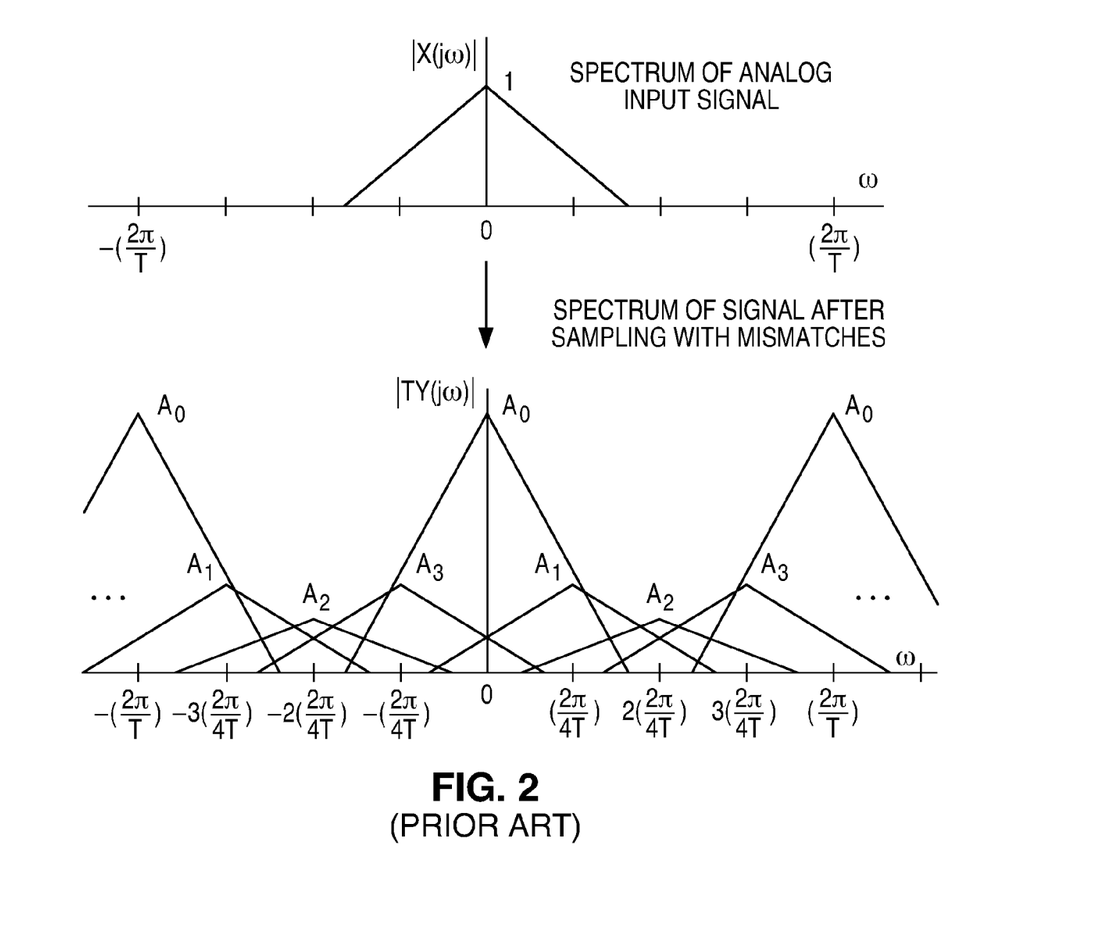
FIG. 2 illustrates the frequency spectrum of the analog input signal x(T) and the corresponding frequency spectrum of the digitized signal x(nT).

More specifically, gain mismatches, offset mismatches, and sampling clock (timing) skew mismatches between the sub-ADCs result in the introduction of unwanted spurious harmonics in the digitized and demultiplexed output x(nT). Such unwanted harmonics manifest themselves in the frequency domain representation of the digital output x(nT) as power-scaled replicas of the original input signal x(T), centered at regular frequency intervals, as shown in FIG. 2. FIG. 2 illustrates the frequency spectrum of the analog input signal x(T) and the corresponding frequency spectrum of the digitized signal x(nT). Referring to FIG. 2, the unwanted replicas of the input signal in the digitized output signal are referred as spurious images.

The fundamental reason behind the onset of spurious images at regular frequency intervals is that, as the original input signal x(t) is periodically processed by the mismatched sub-ADCs $ADC_0$ to $ADC_{M-1}$, the small differences in the conversion process introduced by the mismatched sub-ADCs get mixed with the converted signal x(nT). It is well-known that mixing a periodic function with a signal results in spurious images of the original signal at periodic/regular frequency intervals directly related to the periodicity of the modulating function.

In order to minimize the power of the unwanted spurious images, several approaches have been proposed, including calibrating the sub-ADCs to compensate the channel to channel mismatches, reducing sampling skew by means of a master clock, randomizing the internal conversion paths of the sub-ADCs, among others.

The parallel time-interleaving analog-to-digital converters have many advantages and accompanying limitations.

DETAILED DESCRIPTION OF THE PREFERRED EMBODIMENTS

In accordance with the principles of the present invention, a parallel digital-to-analog converter (DAC) system uses an array of digital-to-analog converters (DACs) to performing parallel digital-to-analog conversion in a time-interleaved manner. The parallel DAC system includes input signal processing operations prior to the conversion operation to minimize errors and unwanted signal effects due to mismatches between the array of DACs. By using a parallel array of DACs, each DAC can operate at a slow rate of speed while the overall DAC system is still capable of providing fast conversion results. As thus configured, the parallel DAC system of the present invention is capable of fast conversion speed, accurate conversion result and low power consumption.

More specifically, in the parallel DAC system of the present invention, the digital input data stream is sampled at clock rate $f_s$ in a time-interleaved manner into an array of M data streams at a clock rate of $f_s/M$. The M data streams are then transformed into a different data representation. By virtue of this data transformation, the periodicity of the sampled data streams due to the time-interleaved sampling is masked and the transformed data streams are then applied to the array of parallel DACs. Hence, the parallel DAC system of the present invention minimizes the effect of mismatches in the sub-DACs before these mismatches are introduced into the converted output signal.

Figure 3:
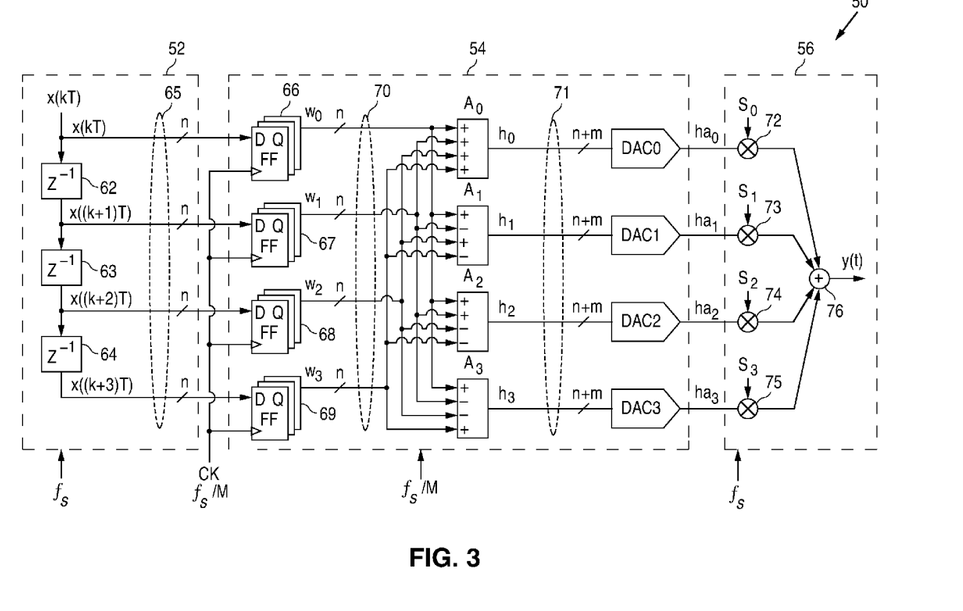
FIG. 3 is a schematic diagram of a parallel digital-to-analog converter (DAC) system according to one embodiment of the present invention.

FIG. 3 is a schematic diagram of a parallel digital-to-analog converter (DAC) system according to one embodiment of the present invention. Referring to FIG. 3, parallel DAC system 50 includes an input sampling block 52, a data processing and conversion block 54 and an output signal generation block 56. The input sampling block 52 and the output signal generation block 56 are clocked at a frequency $f_s$ while the data processing and conversion block 54 is clocked at a frequency $f_s/M$, where M represents the number of parallel conversion channels in parallel DAC system 50. In the present embodiment, parallel DAC system 50 includes four parallel conversion channels and therefore, M=4. However, one of ordinary skill in the art would appreciate that parallel DAC system 50 of the present invention can be generalized to an arbitrary number of parallel conversion channels M. The use of four parallel channels in the present embodiment is illustrative only.

Parallel DAC system 50 receives an n-bit digital input data signal x(kT) and generates an analog output signal y(t). In parallel DAC system 50, the n-bit digital input data x(kT) clocked at frequency $f_s$ is fed into input sampling block 52. Input sampling block 52 includes a cascade of M−1 unit delay elements 62-64 depicted as $z^{-1}$ in FIG. 3. That is, the M−1 unit delay elements 62-64 are connected in series. The received digital input data x(kT) is provided directly as an output signal and is coupled to the first unit delay element 62 which couples its output to the second unit delay element 63. The second unit delay element 63 couples its output to the third unit delay element 64. The three unit delay elements 62-64 provide three n-bit delayed input data signals have respective increasing amount of unit delay. In one embodiment, unit delay elements 62-64 are implemented as shift registers connected in series and clocked at a clock rate of $f_s$.

Input sampling block 52, when clocked at frequency $f_s$, simultaneously provides the n-bit digital input data signal and three n-bit delayed input data signals on data busses 65. In general, data busses 65 include N number of n-bit busses. In the present embodiment, data busses 65 include four n-bit busses.

In operation, at the end of each four clock cycles of clock $f_s$, four digital signals each with increasing amount of unit delay are provided on data busses 65 and the four digital signals are reloaded or refreshed at each four clock cycles. That is, at the end of the first four clock cycles, digital signals x(kT), x((k+1)T), x((k+2)T) and x((k+3)T) are provided on data busses 65. Then, at the end of the next four clock cycles, digital signals x((k+4)T), x((k+5)T), x((k+6)T) and x((k+7)T) are provided on data bussees 65. For the case of M channels, at the end of each M clock cycles, M digital signals with increasing amount of unit delay are provided on the M n-bit data busses.

Data processing and conversion block 54 includes M banks of D-Flip-Flops (D-FFs) 66-69 clocked by a clock signal CK. Clock signal CK has a clock rate of $f_s/M$. Each bank of D-FFs includes n number of D-Flip-Flops, one for each bit of the n-bit digital input data. In the present embodiment, there are four banks of D-FFs corresponding to the four parallel channels of parallel DAC system 50. The M banks of D-FFs 66-69 provides n-bit D-FF output signals $w_0$, $w_1$, $w_2$ and $w_3$ forming D-FF output busses 70, also referred to as the w busses 70.

The M parallel and simultaneous n-bit data busses 65, clocked at frequency $f_s$, are coupled to the respective data input terminals of the M banks of D-FFs. That is, the first data bus carrying n-bit digital input data signal x(kT) is coupled to the first bank of D-FFs 66 where each bit of the n-bit data signal x(kT) is coupled to a respective D-FF in D-FF bank 66. Similarly, the second data bus carrying n-bit delayed input data signal x((k+1)T) is coupled to the second bank of D-FFs 67 where each bit of the n-bit data signal x((k+1)T) is coupled to a respective D-FF in D-FF bank 67. Similarly configuration applies to the third and fourth data busses carrying n-bit delayed input data signals x((k+2)T) and x((k+3)T) which are coupled to respective third and fourth banks of D-FFs 68 and 69. Note that at each M clock cycles, the digital signals at data busses 65 are reloaded and a new set of n-bit data signals are provided on data buses 65, as described above. The use of digital signals x(kT), x((k+1)T), x((k+2)T) and x((k+3)T) in the above description refers of course to the first M clock cycles of clock $f_s$ only. It is understood that at each M clock cycles, a new set of digital signals are loaded onto data busses 65 and provided to D-FF banks 66-69.

In operation, D-FF banks 66-69 are clocked by clock signal CK which is an $f_s/M$ clock signal. The clock signal CK is aligned with respect to the $f_s$ clock of the unit delay elements 62-64 so that D-FF banks 66-69 are clocked for every M clock cycles of the $f_s$ clock. Furthermore, because the D-FF banks 66-69 are clocked by a clock signal that is M times slower than the $f_s$ clock, the n-bit output signals of the D-FF banks 66-69, denoted as $w_0$, $w_1$, $w_2$ and $w_3$ respectively, are going to hold the M digital signals received on data busses 65 for a period of time equal to $M \cdot T = 1/(f_s/M)$.

More specifically, the n-bit D-FF output signals $w_0$, $w_1$, $w_2$ and $w_3$ are given as:

$$w_0(t) = x(kT),$$

$$w_1(t) = x((k+1)T),$$

$$w_2(t) = x((k+2)T),$$

$$w_3(t) = x((k+3)T) \text{ for } t_0 < t < t_0 + M \cdot T,$$

$$w_0(t) = x((k+4)T),$$

$$w_1(t) = x((k+5)T),$$

$$w_2(t) = x((k+6)T),$$

$$w_3(t) = x((k+7)T) \text{ for } t_0 + M \cdot T < t < t_0 + M \cdot 2T, \quad \text{Eq. (1)}$$

and so on, where T is the clock period of the input data signal and is equal to $1/f_s$ and $t_0$ is chosen to allow proper Flip-Flop timing alignment. By clocking the D-FF banks 66-69 using clock signal CK, the four D-FF output busses 70 change state simultaneously every M·T seconds.

In other words, at the end of the first four clock cycles, digital signals x(kT), x((k+1)T), x((k+2)T) and x((k+3)T) are provided on data busses 65. Then, clock CK is triggered to cause D-FF banks 66-69 to simultaneously capture the four digital signals x(kT), x((k+1)T), x((k+2)T) and x((k+3)T). D-FF banks 66-69 will hold these digital signals as the output signals $w_0$, $w_1$, $w_2$ and $w_3$ for a full clock cycle of the CK clock which is M·T seconds. Meanwhile, input sampling block 52 is loading the next set of digital signals x((k+4)T), x((k+5)T), x((k+6)T) and x((k+7)T) onto data busses 65 and these digital signals are presented to the D-FF banks 66-69. However, these new set of digital signals are not loaded until the CK clock is triggered again after M·T seconds.

Data processing and conversion block 54 further includes M numbers of signed digital adders $A_0$-$A_3$, each signed digital adders having M numbers of input terminals. In the present embodiment, four signed digital adders $A_0$-$A_3$ are used and each signed digital adder has four input terminals. The four input terminals of each signed digital adders $A_0$-$A_3$ are coupled to received the four D-FF output signals $w_0$, $w_1$, $w_2$ and $w_3$. In other words, the four D-FF output signals $w_0$, $w_1$, $w_2$ and $w_3$ are coupled to each of adders $A_0$-$A_3$.

The M number of signed digital adders $A_0$-$A_3$ provides M digital output signals $h_0$-$h_3$ forming M adder output busses 71, also referred to as the h busses 71. Each of digital output signals $h_0$-$h_3$ is (n+m)-bit which is m number of bits greater than the n-bit input signals to the signed digital adder. This is because the resulting sums of the signed digital adder $A_0$-$A_3$, to be properly represented without incurring into overflow, require n+m bits. For example, if all four inputs of adder $A_0$ are n-bit ones (11111 . . . +11111 . . . +11111 . . . + 11111 . . . ), the resulting addition will require extra m=2 bits. Thus, adders $A_0$-$A_3$ will need to be implemented as n+2 bits adders when M is equal to 4.

Signed digital adders $A_0$-$A_3$ are implemented with signs for addition and subtraction to realize a data transformation of the n-bit digital data signals on the w busses 70 to the (n+m)-bit digital data signals on the h busses 71 based on the well-known Hadamard matrix. Specifically, the four (n+m)-bit parallel and simultaneous h busses 71 represent a transform of the w busses 70 based the following formulas:

$$\begin{cases} h_0 = w_0 + w_1 + w_2 + w_3 \\ h_1 = w_0 - w_1 + w_2 - w_3 \\ h_2 = w_0 + w_1 - w_2 - w_3 \\ h_3 = w_0 - w_1 - w_2 + w_3 \end{cases} = \begin{bmatrix} 1 & 1 & 1 & 1 \\ 1 & -1 & 1 & -1 \\ 1 & 1 & -1 & -1 \\ 1 & -1 & -1 & 1 \end{bmatrix} \cdot \begin{bmatrix} w_0 \\ w_1 \\ w_2 \\ w_3 \end{bmatrix} = H \cdot \begin{bmatrix} w_0 \\ w_1 \\ w_2 \\ w_3 \end{bmatrix}, \quad \text{Eq. (2)}$$

where H in Equation (2) above denotes the Hadamard matrix. Hadamard matrix H is a 4×4 matrix in the present embodiment. In general, the Hadamard matrix H used in the data transformation operation of the parallel DAC of the present invention will be an M×M matrix.

The signs for the Hadamard matrix H in equation (2) represent the signs for the addition/subtraction implemented at digital adders $A_0$-$A_3$. Thus, adder $A_0$ implements the first column of the Hadamard matrix H, adder $A_1$ implements the second column of the Hadamard matrix H, adder $A_2$ implements the third column of the Hadamard matrix H, and finally, adder $A_3$ implements the fourth column of the Hadamard matrix H.

The Hadamard matrix is described in Linear Systems, by T. Kailath, Prentice Hall, 1979. The transformation realized by the Hadamard matrix can be generalized for different values of M where the Hadamard matrix is an M×M matrix. In general, a Hadamard matrix is a square matrix whose entries are either +1 or -1 and whose rows are mutually orthogonal. This means that every two different rows in a Hadamard matrix represent two perpendicular vectors. More specifically, an M×M matrix H=(hij) is a Hadamard matrix of order M if the entries of H are either +1 or -1 and $HH^T=MI$, where $H^T$ is the transpose of H and I is the Mth order identify matrix. Thus, an M×M matrix with only +1 and -1 as its elements is Hadamard if the inner product of two distinct rows is 0 and the inner product of a row with itself is M.

When Equation (1) is substituted into Equation (2), the following set of equations for the adder output signals $h_0$, $h_1$, $h_2$, and $h_3$ is derived, with appropriate time-shift:

$$h_0 = x(kT) + x((k+1)T) + x((k+2)T) + x((k+3)T)$$

$$h_1 = x(kT) - x((k+1)T) + x((k+2)T) - x((k+3)T)$$

$$h_2 = x(kT) + x((k+1)T) - x((k+2)T) - x((k+3)T)$$

$$h_3 = x(kT) - x((k+1)T) - x((k+2)T) + x((k+3)T). \quad \text{Eq. (3)}$$

From Equation (3), it is apparent that although the information on the input signal sequence x(kT) has been preserved, the actual sequential order of the input signal sequence has been "masked" by being summed into the simultaneous h busses. Each adder output signal $h_0$, $h_1$, $h_2$, or $h_3$ contains information of the input signal at time kT, (k+1)T, and so on but the sequential order is masked by the data transformation based on the Hadamard matrix implemented by the digital adders $A_0$-$A_3$.

Data processing and conversion block 54 includes M numbers of digital-to-analog converters DAC0 to DAC3. In the present description, converters DAC0 to DAC3 will also be referred to as sub-digital-to-analog converters or sub-DACs. Sub-DACs DAC0 to DAC3 are identical digital-to-analog converters and are each an (n+m)-bit DAC. The adder output busses 71 are coupled as inputs to the sub-DACs. The sub-DACs perform the actual conversion of the signals from the digital domain to the analog domain. At the conversion process, although the nominal number of bits for the sub-DACs is higher than n, the sub-DACs' output rate is significantly lower. Specifically, the conversion rate is $f_s/M$ which is the frequency of the data processing and conversion block 54 which is lower than the frequency $f_s$ of the digital input signal.

The analog output signals from each of the sub-DACs DAC0 to DAC3 form the output signals from the data processing and conversion block 54 and are coupled to the output signal generation block 56. Output signal generation block 56 includes a bank of M number of mixers 72-75. The analog output signals from the sub-DACs are coupled to a respective mixer 72-75 to be multiplied with a respective mixing signal $S_0$-$S_3$. The mixing signals $S_0$-$S_3$ are shown in the timing diagram of FIG. 4. Mixing signals $S_0$-$S_3$ correspond to the columns of the Hadamard matrix H. Thus, signal $S_0$ is always at level 1; signal $S_1$ is the sequence 1, -1, 1, −1; signal $S_2$ is the sequence 1, 1, −1, −1; and signal $S_3$ is the sequence 1, −1, −1, 1. The total period of all the signal sequences is M·T. In general, for M number of parallel conversion channels, the Hadamard matrix is M×M and mixing signals $S_0$ to $S_{M-1}$ are provided in accordance with the columns of the Hadamard matrix.

Figure 4:
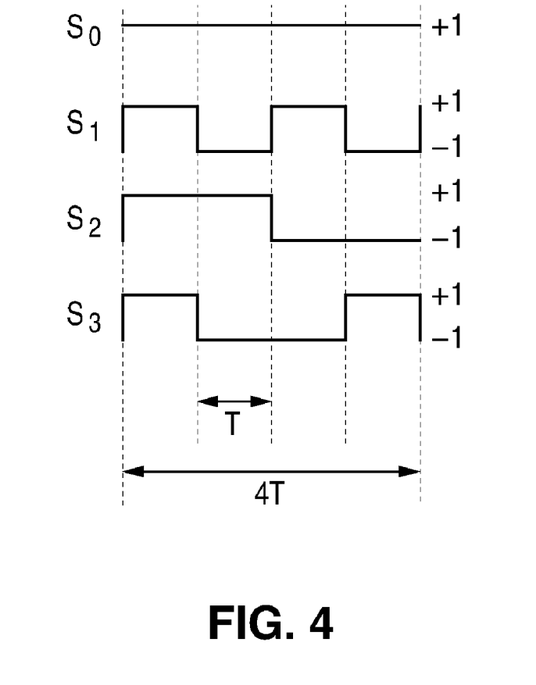
FIG. 4 is a timing diagram of the mixing signals $S_0$ to $S_3$ to be applied to the respective mixers in the parallel digital-to-analog converter of FIG. 3 according to one embodiment of the present invention.

In the timing diagram of FIG. 4, the fastest sequence is signal $S_1$, with period (M·T)/2=$f_s$/2. However, the output signal generation block 56 is clocked at a frequency of $f_s$ because in practice, signals $S_0$-$S_3$ are synthesized from frequency $f_s$.

In output signal generation block 56, each mixer 72-75 multiples the analog signals from the respective sub-DACs DAC0-DAC3 and generates a mixer output signal. The four mixer output signals are added together at an adder 76 to form the final converted analog output y(t). It can be verified that, as result of the mixing and adding process implemented at mixers 72-75 and adder 76, the final analog output y(t) corresponds to the analog converted input digital data sequence x(kT) at frequency $f_s$. In fact, when $ha_0$, $ha_1$, $ha_2$, and $ha_3$ represents the analog outputs of the sub-DACs, signals $ha_0$, $ha_1$, $ha_2$, and $ha_3$ are ideal analog replica of the digital signals $h_0$, $h_1$, $h_2$, and $h_3$. The final analog output signal y(t) is thus given as:

$$y(t) = ha_0 \cdot S_0 + ha_1 \cdot S_1 + ha_2 \cdot S_2 + ha_3 \cdot S_3 \quad \text{Eq. (4)}$$
$$= h_0 \cdot S_0 + h_1 \cdot S_1 + h_2 \cdot S_2 + h_3 \cdot S_3$$

When Equation (3) for $h_0$, $h_1$, $h_2$, and $h_3$ is substituted into Equation (4), the analog output signal y(t) during the first T seconds of the S waveforms ($S_0$=1, $S_1$=1, $S_2$=1, $S_3$=1) is given as:

$$y(t) = h_0 \cdot 1 + h_1 \cdot 1 + h_2 \cdot 1 + h_3 \cdot 1$$
$$= (x(kT) + x((k+1)T) + x((k+2)T) + x((k+3)T)) \cdot 1 +$$
$$(x(kT) - x((k+1)T) + x((k+2)T) - x((k+3)T)) \cdot 1 +$$
$$(x(kT) + x((k+1)T) - x((k+2)T) - x((k+3)T)) \cdot 1 +$$
$$(x(kT) - x((k+1)T) - x((k+2)T) + x((k+3)T)) \cdot 1$$
$$= x(kT).$$

During the following T seconds interval where $S_0$=1, $S_1$=−1, $S_2$=1, $S_3$=−1, the analog output signal y(t) is given as:

$$y(t) = h_0 \cdot 1 + h_1 \cdot (-1) + h_2 \cdot 1 + h_3 \cdot (-1)$$
$$= (x(kT) + x((k+1)T) + x((k+2)T) + x((k+3)T)) \cdot 1 +$$
$$(x(kT) - x((k+1)T) + x((k+2)T) - x((k+3)T)) \cdot (-1) +$$
$$(x(kT) + x((k+1)T) - x((k+2)T) - x((k+3)T)) \cdot 1 +$$
$$(x(kT) - x((k+1)T) - x((k+2)T) + x((k+3)T)) \cdot (-1)$$
$$= x((k+1)T).$$

Similarly, it can be readily verified that y(t) will be equal to x((k+2)T) in the subsequent interval T, and so on. Thus, the analog mixers 72-75 and the final adder 76 operate to return the parallel processed signals to the original input signal sequence at full output rate $f_s$. In practice, mixers 72-75 and the adder 76 operate to reverse the data transformation of Equation (2) performed by adders $A_0$ to $A_3$ prior to the analog conversion by the sub-DACs.

In the present description, the mixing signals $S_0$-$S_3$ are represented as having either one of the two logic states 1 or −1 instead of logical states of 1 or 0. One of ordinary skill in the art will recognize that the use of 1/−1 to represent the two logical states has no fundamental impact in terms of circuit implementations.

Figure 5:
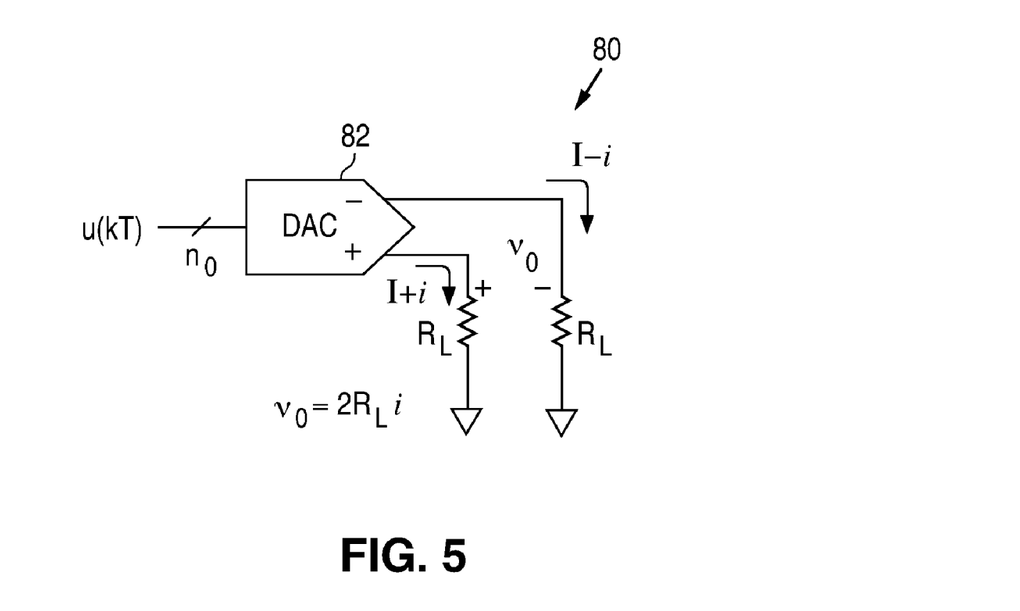
FIG. 5 is a schematic diagram of a digital-to-analog converter (DAC) circuit which can be applied as the sub-DAC DAC0-3 in the parallel digital-to-analog converter of FIG. 3 according to one embodiment of the present invention.

FIG. 5 is a schematic diagram of a digital-to-analog converter (DAC) circuit which can be applied as the sub-DAC DAC0-3 in the parallel digital-to-analog converter of FIG. 3 according to one embodiment of the present invention. Referring to FIG. 5, DAC circuit 80 is a high speed DAC implemented as a current-sourcing circuit injecting a differential analog current i onto an output load represented as resistors $R_L$. In DAC circuit 80, a current source DAC circuit 82 generates a differential current i representing the result of the conversion of the digital input u(kT) of no bits where $n_0$ is n+m. The differential current i is superimposed onto a common mode current I. When the differential current i is injected onto the load resistors $R_L$, a differential voltage $v_o$ is generated having a value given as: $v_o$=2$R_L$i.

Figure 6:
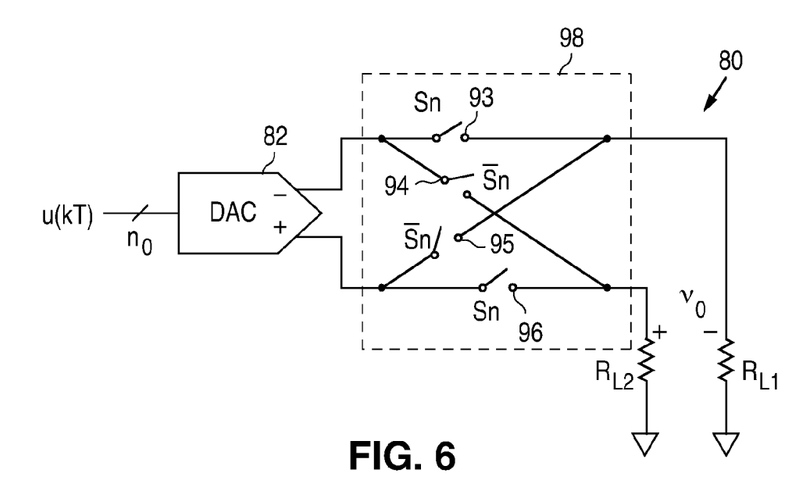
FIG. 6 is a schematic diagram of a mixer circuit which can be used to implement the mixers in the parallel digital-to-analog converter of FIG. 3 according to one embodiment of the present invention.

When each of the sub-DACs in parallel DAC system 50 is implemented as current sourcing circuits as shown in FIG. 5, each of the mixers 72-75 in the output signal generation block 56 can be implemented as a "butterfly network" incorporated in the current sourcing DAC circuits. FIG. 6 is a schematic diagram of a mixer circuit which can be used to implement the mixers in the parallel digital-to-analog converter of FIG. 3 according to one embodiment of the present invention. Referring to FIG. 6, a mixer circuit 98, formed as a cross-coupled network ("butterfly network") of switches, is incorporated in the output current paths of the current source DAC circuit 80. Specifically, the butterfly network of switches includes switches 93 to 96. Each of the switches is controlled by the mixing signal $S_n$ or its complement $\overline{S}_n$ where $S_n$ is the respective mixing signals $S_0$ to $S_3$ for that mixer.

The cross-coupled switch connection in mixer circuit 98 is as follows. Switch 93 is connected between the negative output terminal of DAC circuit 82 and the first load resistor $R_{L1}$. Switch 93 is controlled by mixing signal $S_n$. Switch 94 is connected between the negative output terminal of DAC circuit 82 and the second load resistor $R_{L2}$. Switch 94 is controlled by the complement mixing signal $\overline{S}_n$. Switch 95 is connected between the positive output terminal of DAC circuit 82 and the first load resistor $R_{L1}$. Switch 95 is controlled by the complement mixing signal $\overline{S}_n$. Switch 96 is connected between the positive output terminal of DAC circuit 82 and the second load resistor $R_{L2}$. Switch 96 is controlled by mixing signal $S_n$. Note that first and second load resistors $R_{L1}$, $R_{L2}$ have the same resistance value $R_L$.

In one embodiment, switches 93 to 96 are implemented as PMOS transistors where the gate terminals are controlled by the respective mixing signal $S_n$ or its complement $\overline{S}_n$. In other embodiments, NMOS transistors, CMOS transistor gates, or bipolar transistors can be used to implement the switches in the mixer circuit. One of ordinary skill in the art would appreciate that switches 93 to 96 can be implemented in a variety of manner to realize the switching function. The exact implementation of switches 93 to 06 is not critical to the practice of the parallel DAC system of the present invention.

Figure 7:
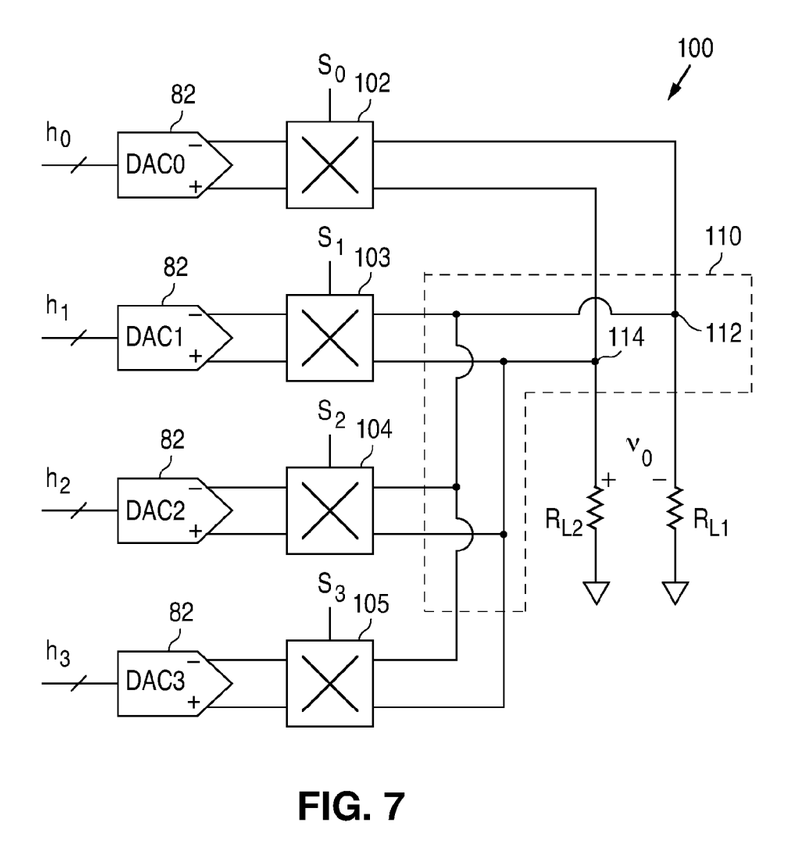
FIG. 7 is a schematic diagram illustrating an implementation of the mixer circuits and the final adder in the DAC circuits used as the sub-DACs of the parallel digital-to-analog converter of FIG. 3 according to one embodiment of the present invention.

When each of the sub-DACs and the mixers in parallel DAC system 50 are implemented as shown in FIG. 6, the adder 76 can be formed by adding the differential output currents generated by the mixer circuit 98 and coupled to the load resistors $R_{L1}$, $R_{L2}$. FIG. 7 is a schematic diagram illustrating an implementation of the mixer circuits and the final adder in the DAC circuits used as the sub-DACs of the parallel digital-to-analog converter of FIG. 3 according to one embodiment of the present invention.

Referring to FIG. 7, each of sub-DACs DAC0 to DAC3 is implemented using the DAC circuit shown in FIG. 5 and includes a current sourcing DAC circuit 82. The negative and positive output terminals of each DAC circuit 82 are coupled to a respective mixer circuit 102 to 105. Each mixer circuit 102 to 105 is controlled by respective mixing signals $S_0$ to $S_3$. For example, mixer circuit 102 is coupled to sub-DAC DAC0 and is controlled by mixing signal $S_0$ and its complement. Mixer circuit 103 is coupled to sub-DAC DAC1 and is controlled by mixing signal $S_1$ and its complement, and so on.

To implement the adder function, the differential output terminals of the mixer circuits 102 to 105 are tied together (dotted box 110) at the respective differential output load $R_L$. The final adder 76 is thus implemented by summing the differential output currents from the mixers at the output load $R_L$. Specifically, the negative output terminals of mixers 102-105 are connected together to node 112 which is coupled to the first load resistor $R_{L1}$. Similarly, the positive output terminals of mixers 102-105 are connected together to node 114 which is coupled to the second load resistor $R_{L2}$. In this manner, the currents associated with the negative output terminals of the sub-DACs and the mixers are added at the first load resistor $R_{L1}$ and the currents associated with the positive output terminals of the sub-DACs and the mixers are added at the second load resistor $R_{L2}$.

By using the integrated implementation of FIG. 7, the sub-DACs DAC0-3, the mixers 72-75, and the final adder 76 of the parallel DAC system 50 of FIG. 3 are implemented using high speed and space efficient circuitry. Parallel DAC system 50 is thus capable of providing accurate digital-to-analog conversion results with high accuracy and without unwanted harmonics typically associated with parallel processing systems.

Figure 8:
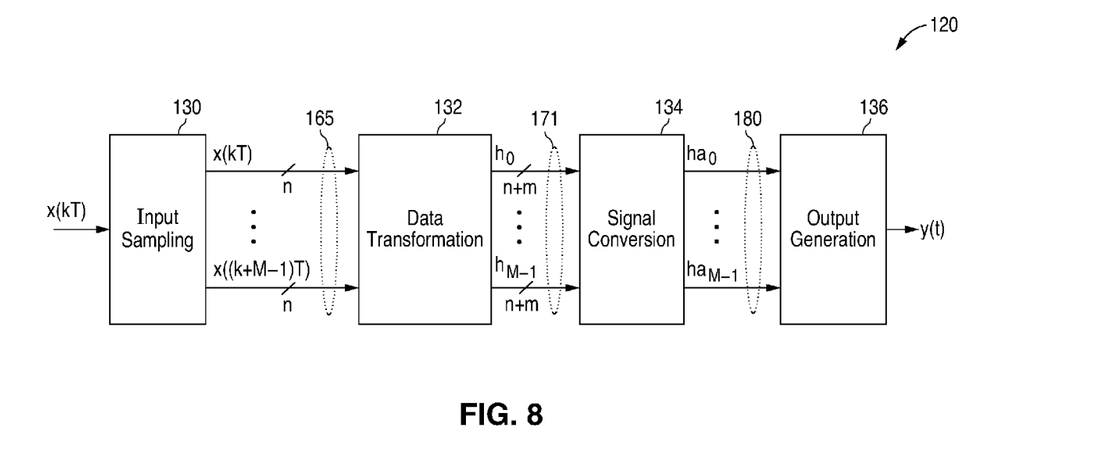
FIG. 8 is a block diagram of a parallel digital-to-analog converter system according to another embodiment of the present invention.

FIG. 3 above illustrates one embodiment of the parallel DAC system of the present invention. The parallel DAC system of FIG. 3 can be generalized into four functional blocks as shown in FIG. 8. FIG. 8 is a block diagram of a parallel digital-to-analog converter system according to another embodiment of the present invention. Referring to FIG. 8, a parallel DAC system 120 according to another embodiment of the present invention having M parallel conversion channels includes an input sampling block 130, a data transformation block 132, a signal conversion block 134, and an output signal generation block 136. The input sampling block 130 receives the n-bit digital input signal sequence x(kT) and generates M−1 delayed digital input signals therefrom. The input sample block provides M n-bit digital signals on busses 165 to the data transformation block 132.

The data transformation block 132 transforms the M n-bit digital signals on busses 165 to M (n+m)-bit transformed digital signals on busses 171 based on an M×M Hadamard matrix.

In one embodiment, the M n-bit digital signals are clocked by D-FFs to be held for a given time period and then the signals are applied to M digital adders implementing the M×M Hadamard matrix. The M (n+m)-bit transformed digital signals on busses 171 are then coupled to respective DACs in the signal conversion block 134 to be converted to M analog signals. The M analog signals are provided on busses 180.

The output signal generation block 136 receives the M analog signals on busses 180 and performs a reverse data transformation of the analog signals based on the M×M Hadamard matrix. The reverse transformation involves mixing the analog signals with mixer signals that are based on the Hadamard matrix and then adding the mixed signals. The resultant output signal y(t) is the analog representation of the digital input signal sequence. The individual blocks of the parallel DAC system of FIG. 8 can be implemented in various manner to realize the parallel DAC system of the present invention. The detail implementation in FIG. 3 is illustrative only and is not intended to be limiting. Other circuitry for implementing the parallel DAC system of the present invention is possible as long as the data transformation and reverse transformation based on the Hadamard matrix is implemented.

The above detailed descriptions are provided to illustrate specific embodiments of the present invention and are not intended to be limiting. Numerous modifications and variations within the scope of the present invention are possible. In the above described embodiment, the data processing and conversion block includes D-FFs and adders for performing the data transformation operation prior to the analog conversions. In other embodiments, the data transformation operation of the data processing and conversion block can be implemented using other circuit elements. Furthermore, in the data transformation block, the D-FFs are used to hold the digital input data signal and the M−1 delayed input data signals for a given time period. Other methods for latching or holding the digital data signals on data busses 65 may be used. Furthermore, digital adders $A_0$ to $A_3$ are used to perform the data transformation based on the Hadamard matrix. The exact implementation of the data transformation operation of the data processing and conversion block is not critical to the practice of the present invention as long as the data transformation based on an M×M Hadamard matrix in Equation (2) is carried out. Other implementation for performing the data transformation operation can be used. The present invention is defined by the appended claims.

We claim:

1. A method for performing parallel digital-to-analog conversion of an n-bit digital input data signal at a frequency of $f_s$, comprising:
   receiving the n-bit digital input data signal;
   generating M−1 delayed input data signals, M being the number of parallel conversions channels, the M−1 delayed input data signals having respective increasing amount of unit delay, the digital input data signal and the M−1 delayed input data signals forming M digital signals;
   holding the M digital signals for a first time period;
   performing a data transformation of the M digital signals using an M×M Hadamard matrix;
   generating M (n+m)-bit transformed digital data signals;
   converting each of the M transformed digital data signals to M analog signals; and
   performing a reverse data transformation of the M analog signals based on the M×M Hadamard matrix to generate an output analog signal indicative of the n-bit digital input data signal.

2. The method of claim 1, wherein the first time period is M·T where $T=1/f_s$.

3. The method of claim 1, wherein holding the M digital signals for a first time period comprising latching the M digital signals at a clock rate of $f_s/M$.

4. The method of claim 3, wherein performing a data transformation of the M digital signals comprises:

coupling the M digital signals to a respective one of M digital adders, the M digital adders implementing the signs of the M×M Hadamard matrix;

adding the M digital signals at each respective digital adder according to the signs of the M×M Hadamard matrix; and generating the M (n+m)-bit transformed digital data signals.

5. The method of claim 4, wherein each of the M digital adders implements a column of the M×M Hadamard matrix.

6. The method of claim 1, wherein performing a reverse data transformation of the M analog signals comprising:

multiplying each of the M analog signals with a respective one of M mixing signals to generate M mixed analog signals, the M mixing signals implementing the M×M Hadamard matrix; and summing the M mixed analog signals to generate the output analog signal.

7. The method of claim 6, wherein performing a reverse data transformation of the M analog signals comprises multiplying each of the M analog signals with a respective one of M mixing signals at a clock rate of $f_s$.

8. The method of claim 6, wherein each of the M mixing signals implements a column of the M×M Hadamard matrix.

9. A parallel digital-to-analog converter system for converting an n-bit digital input data signal at a frequency of $f_s$ to an analog output signal y(t), the parallel digital-to-analog converter system comprising:

an input sampling block receiving the n-bit digital input data signal and generating M−1 delayed digital input data signals with respective increasing amount of unit delay, M being the number of parallel conversion channels of the parallel digital-to-analog converter system, the input sampling block providing the digital input data signal and the M−1 delayed digital input data signals as M digital signals at a clock rate of $f_s$;

a data transformation block receiving the M digital signals and transforming the M digital signals using an M×M Hadamard matrix, the data transformation block generating M (n+m)-bit transformed digital data signals;

a signal conversion block receiving the M transformed digital data signals and generating M analog signals; and an output generation block performing a reverse data transformation of the M analog signals based on the M×M Hadamard matrix to generate an output analog signal indicative of the n-bit digital input data signal.

10. The parallel digital-to-analog converter system of claim 9, wherein the input sampling block comprises:

M−1 unit delay elements connected in series, the first unit delay element receiving the digital input data signal, each of the M−1 unit delay elements providing delayed input data signals at the clock rate of $f_s$ with respective increasing amount of unit delay.

11. The parallel digital-to-analog converter system of claim 10, wherein the M−1 unit delay elements comprises M−1 shift registers each clocked at a clock rate of $f_s$.

12. The parallel digital-to-analog converter system of claim 9, wherein the data transformation block comprises:

M D-flip-flops, each of the M D-flip-flops including a clock terminal receiving a clock signal having a clock rate of $f_s/M$, a data input terminal receiving a respective one of the M digital signal, an output terminal providing the respective one of the M digital signals as an output signal for a first time period; and M digital adders, each of the M digital adders receiving the M output signals of the M D-flip-flops, the M digital adders implementing the signs of the M×M Hadamard matrix, the M digital adders providing the M (n+m)-bit transformed digital data signals.

13. The parallel digital-to-analog converter system of claim 12, wherein the first time period is M·T where T=1/$f_s$.

14. The parallel digital-to-analog converter system of claim 12, wherein each of the M digital adders implements a column of the M×M Hadamard matrix.

15. The parallel digital-to-analog converter system of claim 9, wherein the signal conversion block comprises M current sourcing digital-to-analog converters.

16. The parallel digital-to-analog converter system of claim 9, wherein the output generation block comprises:

M mixers, each of the M mixers receiving a respective one of the M analog signals and a respective one of M mixing signals, the M mixing signals implementing the M×M Hadamard matrix, each of the M mixers multiplying a respective M analog signal with a respective M mixing signal to generate a mixed analog signal, the M mixers generating M mixed analog signals; and summing the M mixed analog signals to generate the output analog signal indicative of the n-bit digital input data signal.

17. The parallel digital-to-analog converter system of claim 16, wherein each of the M mixing signals implements a column of the M×M Hadamard matrix.

* * * * *